(12) United States Patent
Kim et al.

(10) Patent No.: US 10,425,189 B2
(45) Date of Patent: Sep. 24, 2019

(54) METHOD FOR PROCESSING DATA BLOCK IN LDPC ENCODER

(71) Applicant: LG ELECTRONICS INC., Seoul (KR)

(72) Inventors: Bonghoe Kim, Seoul (KR); Byounghoon Kim, Seoul (KR); Kwangseok Noh, Seoul (KR); Joonkui Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 35 days.

(21) Appl. No.: 15/663,581

(22) Filed: Jul. 28, 2017

(65) Prior Publication Data

US 2018/0034585 A1   Feb. 1, 2018

Related U.S. Application Data

(60) Provisional application No. 62/368,198, filed on Jul. 29, 2016.

(51) Int. Cl.
| | |
|---|---|
| *H04L 1/00* | (2006.01) |
| *H03M 13/00* | (2006.01) |
| *H03M 13/09* | (2006.01) |
| *H03M 13/11* | (2006.01) |
| *H03M 13/29* | (2006.01) |
| *H03M 13/35* | (2006.01) |

(52) U.S. Cl.
CPC ........ *H04L 1/0057* (2013.01); *H03M 13/091* (2013.01); *H03M 13/116* (2013.01); *H03M 13/1174* (2013.01); *H03M 13/2906* (2013.01); *H03M 13/353* (2013.01); *H03M 13/616* (2013.01); *H03M 13/618* (2013.01); *H03M 13/6356* (2013.01); *H03M 13/6362* (2013.01); *H03M 13/6508* (2013.01); *H03M 13/6516* (2013.01); *H03M 13/6525* (2013.01); *H04L 1/0068* (2013.01); *H03M 13/09* (2013.01); *H04L 1/0061* (2013.01)

(58) Field of Classification Search
CPC ...................................................... H04L 1/0057
USPC ........................................ 714/776, 788, 774
See application file for complete search history.

(56) References Cited

U.S. PATENT DOCUMENTS

| | | | | |
|---|---|---|---|---|
| 2007/0143656 | A1* | 6/2007 | Niu | H03M 13/1102 714/752 |
| 2007/0180349 | A1* | 8/2007 | Jacobsen | H03M 13/1102 714/776 |
| 2007/0263629 | A1* | 11/2007 | Cornett | H04L 49/90 370/392 |
| 2016/0149590 | A1* | 5/2016 | Bao | H03M 13/1174 714/776 |
| 2017/0279464 | A1* | 9/2017 | Noh | H03M 13/116 |

* cited by examiner

*Primary Examiner* — Fritz Alphonse
(74) *Attorney, Agent, or Firm* — Lee, Hong, Degerman, Kang & Waimey

(57) ABSTRACT

A method for communication device processing a data block in a low-density parity-check (LDPC) encoder includes the steps of, if a size of a payload is equal to or greater than a prescribed size, performing code block segmentation, and performing encoding in a unit of a code block on code blocks according to the code block segmentation. In this case, the code block segmentation may be performed by a payload size supported by a parity check matrix (H) corresponding to a coding rate of the LDPC encoder.

14 Claims, 10 Drawing Sheets

METHOD FOR PROCESSING DATA BLOCK IN LDPC ENCODER

Pursuant to 35 U.S.C. § 119(e), this application claims the benefit of U.S. Provisional Patent Application No. 62/368,198, filed on Jul. 29, 2016, the contents of which are hereby incorporated by reference herein in its entirety.

BACKGROUND OF THE INVENTION

Field of the Invention

The present invention relates to a wireless communication system, and more particularly, to a method of processing a data block in an LDPC encoder.

Discussion of the Related Art

In a next generation 5G system, scenarios can be classified into Enhanced Mobile BroadBand (eMBB), Ultra-reliable Machine-Type Communications (uMTC), Massive Machine-Type Communications (mMTC), and the like. The eMBB corresponds to a next generation mobile communication scenario having such characteristics as high spectrum efficiency, high user experienced data rate, high peak data rate, and the like, the uMTC corresponds to a next generation mobile communication scenario having such characteristics as ultra-reliable, ultra-low latency, ultra-high availability, and the like (e.g., V2X, Emergency Service, Remote Control), and the mMTC corresponds to a next generation mobile communication scenario having such a characteristic as low cost, low energy, short packet, massive connectivity (e.g., IoT).

The present invention proposes a coding scheme for providing the abovementioned various services in a 5G system or a new RAT (NR) system.

SUMMARY OF THE INVENTION

Accordingly, the present invention is directed to an apparatus and method thereof that substantially obviate one or more problems due to limitations and disadvantages of the related art.

A technical task of the present invention is to provide a method for communication device processing a data block in a low-density parity-check (LDPC) encoder according to one embodiment.

Another technical task of the present invention is to provide a communication device processing a data block.

Technical tasks obtainable from the present invention are non-limited the above-mentioned technical task. And, other unmentioned technical tasks can be clearly understood from the following description by those having ordinary skill in the technical field to which the present invention pertains.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for a communication device processing a data block in a low-density parity-check (LDPC) encoder, includes the steps of, if a size of a payload is equal to or greater than a prescribed size, performing code block segmentation, and performing encoding in a unit of a code block on code blocks according to the code block segmentation. In this case, the code block segmentation can be performed by a payload size supported by a parity check matrix (H) corresponding to a coding rate of the LDPC encoder. The code block segmentation can be performed to minimize a number of the code block. The code block segmentation can be performed using one of a plurality of payload sizes supported by the parity check matrix (H). The method included further includes, if a size of an encoded bit according to the encoding is not a size defined by the parity check matrix (H) corresponding to a coding rate of the LDPC encoder, the step of performing rate matching on the encoded bit. The rate matching can include shortening, puncturing, and repetition. The method can further include the step of attaching a CRC (cyclic redundancy check) to a code block after the code block segmentation is performed. The payload can be segmented into different payload sizes supported by the parity check matrix (H) corresponding to a coding rate of the LDPC encoder.

To further achieve these objects and other advantages and in accordance with the purpose of the invention, as embodied and broadly described herein, a communication device for processing a data block includes a low-density parity-check (LDPC) encoder, and a processor, if a size of a payload is equal to or greater than a prescribed size, the processor configured to control the LDPC encoder to perform code block segmentation, the processor configured to control the LDPC encoder to perform encoding in a unit of a code block on code blocks according to the code block segmentation, the processor configured to control the LDPC encoder to segment the code blocks into a payload size supported by a parity check matrix (H) corresponding to a coding rate of the LDPC encoder.

The processor can control the LDPC encoder to perform the code block segmentation to minimize a number of the code block. The processor can control the LDPC encoder to perform the code block segmentation using one of a plurality of payload sizes supported by the parity check matrix (H). If a size of an encoded bit according to the encoding is not a size defined by the parity check matrix (H) corresponding to a coding rate of the LDPC encoder, the processor can control the LDPC encoder to perform rate matching on the encoded bit. The rate matching can include shortening, puncturing, and repetition. The processor can be configured to attach a CRC (cyclic redundancy check) to a code block after the code block segmentation is performed. The processor can control the LDPC encoder to perform the code block segmentation to segment the payload into different payload sizes supported by the parity check matrix (H) corresponding to a coding rate of the LDPC encoder.

According to one embodiment of the present invention, it is able to considerably improve encoding performance of an LDPC encoder.

Effects obtainable from the present invention may be non-limited by the above mentioned effect. And, other unmentioned effects can be clearly understood from the following description by those having ordinary skill in the technical field to which the present invention pertains.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
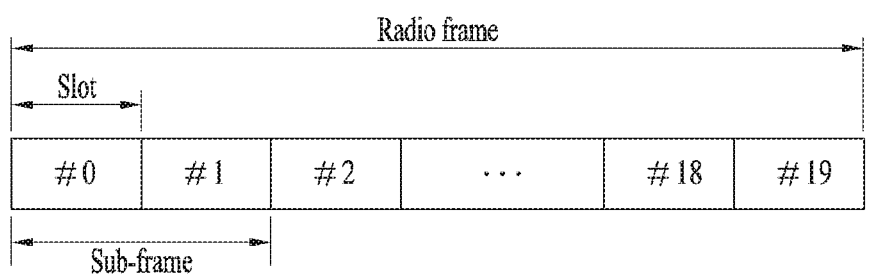
FIG. 1 illustrates a structure of a radio frame of 3GPP LTE.

Reference will now be made in detail to the preferred embodiments of the present invention, examples of which are illustrated in the accompanying drawings. In the following detailed description of the invention includes details to help the full understanding of the present invention. Yet, it is apparent to those skilled in the art that the present invention can be implemented without these details. For instance, although the following descriptions are made in detail on the assumption that a mobile communication system includes 3GPP LTE system, the following descriptions are applicable to other random mobile communication systems in a manner of excluding unique features of the 3GPP LTE.

Occasionally, to prevent the present invention from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like. Although the present specification is described based on 3GPP LTE system, 3GPP LTE-A, or 5G system, contents of the present invention may be applicable to various kinds of other communication systems.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

Techniques, apparatus and systems described herein can be used in various wireless access technologies such as code division multiple access (CDMA), frequency division multiple access (FDMA), time division multiple access (TDMA), orthogonal frequency division multiple access (OFDMA), single carrier frequency division multiple access (SC-FDMA), etc. The CDMA may be implemented with a radio technology such as Universal Terrestrial Radio Access (UTRA) or CDMA2000. The TDMA may be implemented with a radio technology such as Global System for Mobile communications (GSM)/General Packet Radio Service (GPRS)/Enhanced Data Rates for GSM Evolution (EDGE). The OFDMA may be implemented with a radio technology such as institute of electrical and electronics engineers (IEEE) 802.11 (Wi-Fi), IEEE 802.16 (WiMAX), IEEE 802-20, evolved-UTRA (E-UTRA) etc. The UTRA is a part of a universal mobile telecommunication system (UMTS). 3rd generation partnership project (3GPP) long term evolution (LTE) is a part of an evolved-UMTS (E-UMTS) using the E-UTRA. The 3GPP LTE employs the OFDMA in downlink and employs the SC-FDMA in uplink. LTE-advanced (LTE-A) is an evolution of the 3GPP LTE. For clarity, this application focuses on the 3GPP LTE/LTE-A. However, technical features of the present invention are not limited thereto.

FIG. 1 illustrates a structure of a radio frame of 3GPP LTE.

In FIG. 1, a radio frame includes 10 subframes. A subframe includes two slots in time domain. A time for transmitting one subframe is defined as a transmission time interval (TTI). For example, one subframe may have a length of 1 millisecond (ms), and one slot may have a length of 0.5 ms. One slot includes a plurality of orthogonal frequency division multiplexing (OFDM) symbols in time domain. Since the 3GPP LTE uses the OFDMA in the downlink, the OFDM symbol is for representing one symbol period. The OFDM symbol may also be referred to as an SC-FDMA symbol or a symbol period. A resource block (RB) is a resource allocation unit, and includes a plurality of contiguous subcarriers in one slot. The structure of the radio frame is shown for exemplary purposes only. Thus, the number of subframes included in the radio frame or the number of slots included in the subframe or the number of OFDM symbols included in the slot may be modified in various manners.

Figure 2:
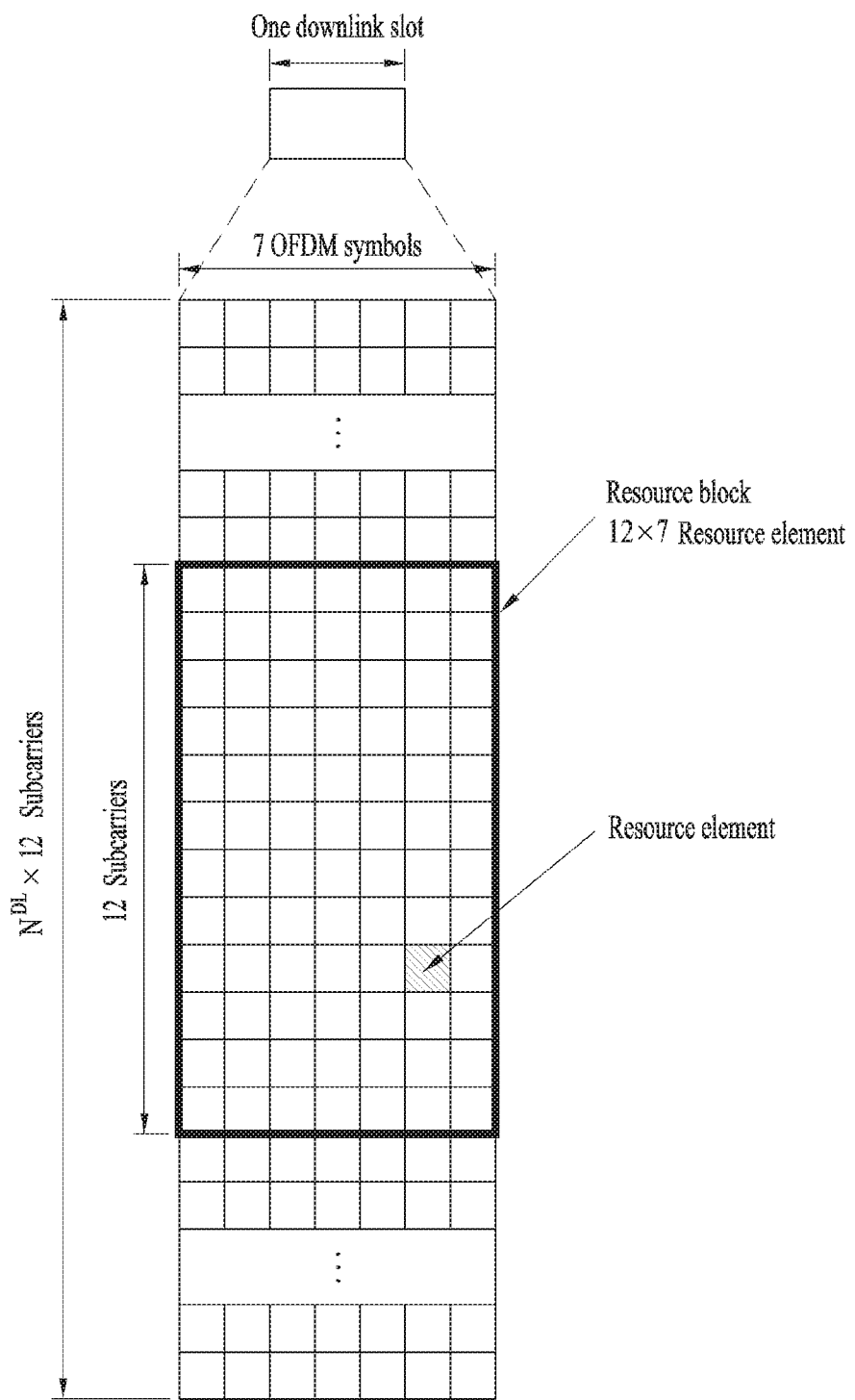
FIG. 2 illustrates resource grid for one downlink slot.

FIG. 2 illustrates resource grid for one downlink slot.

In FIG. 2, a downlink slot includes a plurality of OFDM symbols in time domain. It is described herein that one downlink slot includes 7 OFDM symbols, and one resource block (RB) includes 12 subcarriers in frequency domain as an example. However, the present invention is not limited thereto. Each element on the resource grid is referred to as a resource element (RE). One RB includes 12×7 REs. The number NDL of RBs included in the downlink slot depends on a downlink transmit bandwidth. The structure of an uplink slot may be same as that of the downlink slot.

Figure 3:
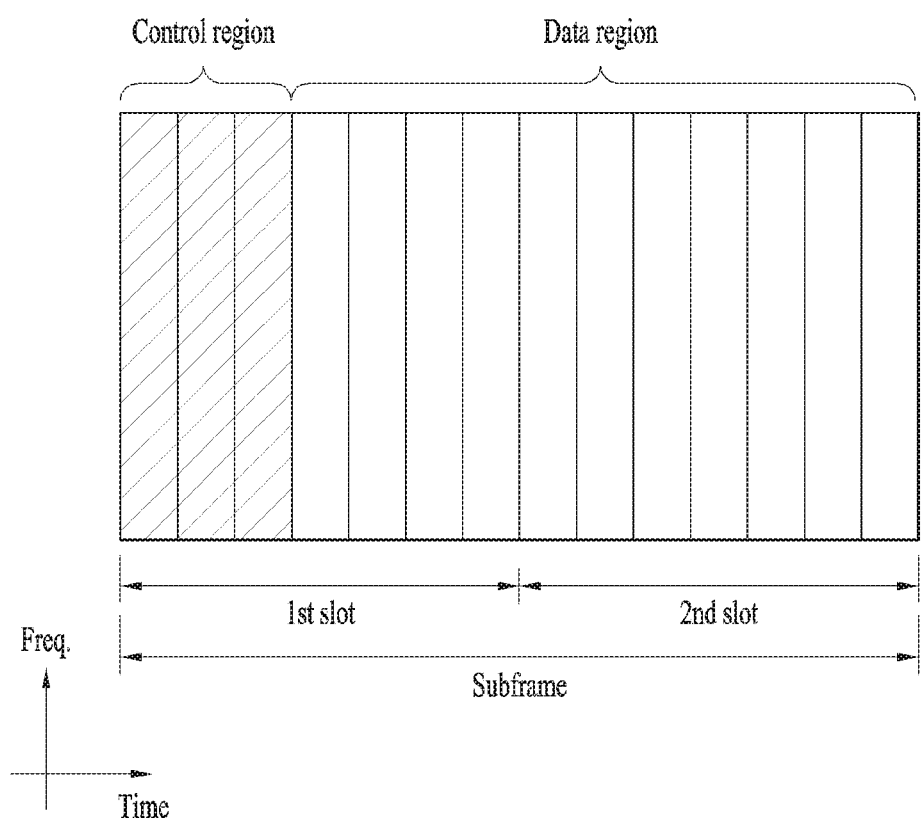
FIG. 3 illustrates structure of downlink subframe.

FIG. 3 illustrates structure of downlink subframe.

In FIG. 3, a maximum of three OFDM symbols located in a front portion of a first slot within a subframe correspond to a control region to be assigned with a control channel. The remaining OFDM symbols correspond to a data region to be assigned with a physical downlink shared chancel (PDSCH). Examples of downlink control channels used in the 3GPP LTE includes a physical control format indicator channel (PCFICH), a physical downlink control channel (PDCCH), a physical hybrid ARQ indicator channel (PHICH), etc. The PCFICH is transmitted at a first OFDM symbol of a subframe and carries information regarding the number of OFDM symbols used for transmission of control channels within the subframe. The PHICH is a response of uplink transmission and carries an HARQ acknowledgment (ACK)/not-acknowledgment (NACK) signal. Control information transmitted through the PDCCH is referred to as downlink control information (DCI). The DCI includes uplink or downlink scheduling information or includes an uplink transmit (Tx) power control command for arbitrary UE groups.

The PDCCH may carry a transport format and a resource allocation of a downlink shared channel (DL-SCH), resource allocation information of an uplink shared channel (UL-SCH), paging information on a paging channel (PCH), system information on the DL-SCH, a resource allocation of an upper-layer control message such as a random access response transmitted on the PDSCH, a set of Tx power control commands on individual UEs within an arbitrary UE group, a Tx power control command, activation of a voice over IP (VoIP), etc. A plurality of PDCCHs can be transmitted within a control region. The UE can monitor the plurality of PDCCHs. The PDCCH is transmitted on an aggregation of one or several consecutive control channel elements (CCEs). The CCE is a logical allocation unit used to provide the PDCCH with a coding rate based on a state of a radio channel. The CCE corresponds to a plurality of resource element groups (REGs). A format of the PDCCH and the number of bits of the available PDCCH are determined according to a correlation between the number of CCEs and the coding rate provided by the CCEs. The BS determines a PDCCH format according to a DCI to be transmitted to the UE, and attaches a cyclic redundancy check (CRC) to control information. The CRC is masked with a unique identifier (referred to as a radio network temporary identifier (RNTI)) according to an owner or usage of the PDCCH. If the PDCCH is for a specific UE, a unique identifier (e.g., cell-RNTI (C-RNTI)) of the UE may be masked to the CRC. Alternatively, if the PDCCH is for a paging message, a paging indicator identifier (e.g., paging-RNTI (P-RNTI)) may be masked to the CRC. If the PDCCH is for system information (more specifically, a system information block (SIB) to be described below), a system information identifier and a system information RNTI (SI-RNTI) may be masked to the CRC. To indicate a random access response that is a response for transmission of a random access preamble of the UE, a random access-RNTI (RA-RNTI) may be masked to the CRC.

Figure 4:
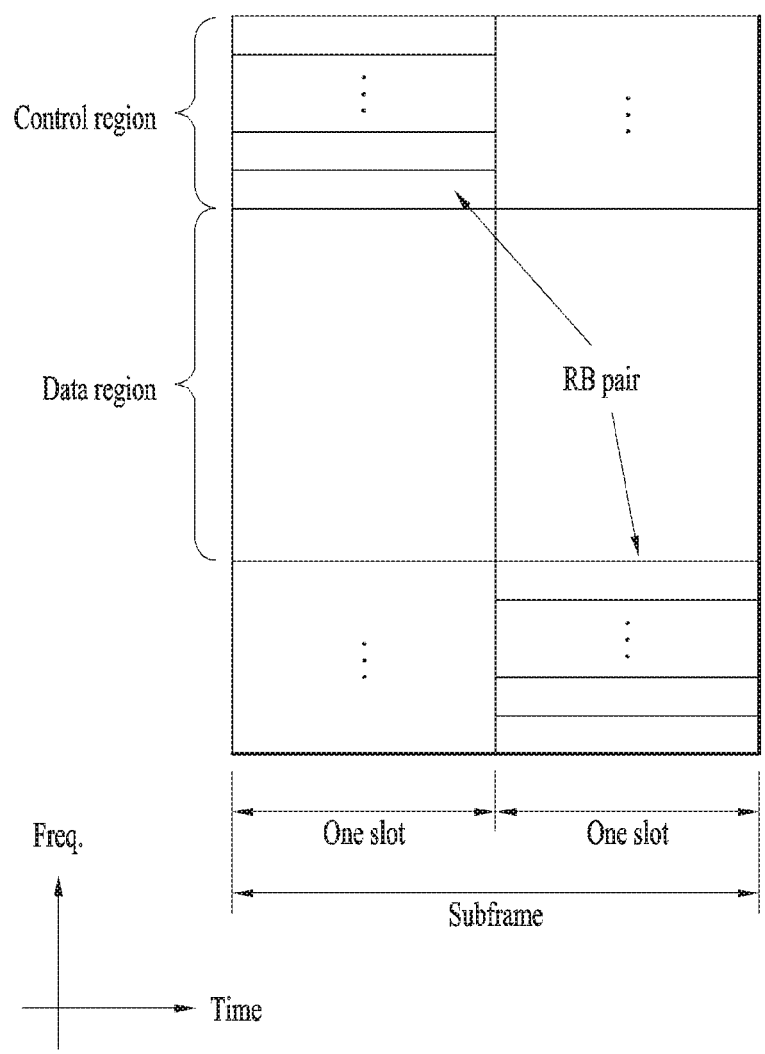
FIG. 4 illustrates structure of uplink subframe.

FIG. 4 illustrates structure of uplink subframe.

In FIG. 4, an uplink subframe can be divided in a frequency domain into a control region and a data region. The control region is allocated with a physical uplink control channel (PUCCH) for carrying uplink control information. The data region is allocated with a physical uplink shared channel (PUSCH) for carrying user data. To maintain a single carrier property, one UE does not simultaneously transmit the PUCCH and the PUSCH. The PUCCH for one UE is allocated to an RB pair in a subframe. RBs belonging to the RB pair occupy different subcarriers in respective two slots. This is called that the RB pair allocated to the PUCCH is frequency-hopped in a slot boundary.

Figure 5:
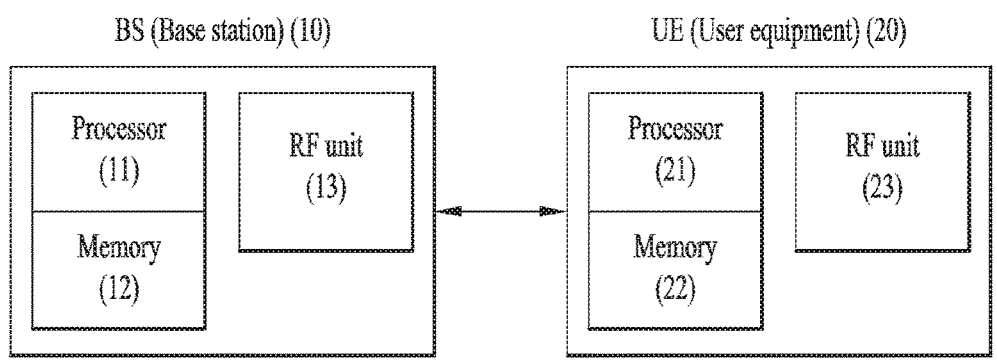
FIG. 5 illustrates system for implementing present invention.

FIG. 5 illustrates system for implementing present invention.

In FIG. 5, a wireless communication system includes a BS 10 and one or more UE 20. In downlink, a transmitter may be a part of the BS 10, and a receiver may be a part of the UE 20. In uplink, a transmitter may be a part of the UE 20, and a receiver may be a part of the BS 10. A BS 10 may include a processor 11, a memory 12, and a radio frequency (RF) unit 13. The processor 11 may be configured to implement proposed procedures and/or methods described in this application. The memory 12 is coupled with the processor 11 and stores a variety of information to operate the processor 11. The RF unit 13 is coupled with the processor 11 and transmits and/or receives a radio signal. A UE 20 may include a processor 21, a memory 22, and a RF unit 23. The processor 21 may be configured to implement proposed procedures and/or methods described in this application. The memory 22 is coupled with the processor 21 and stores a variety of information to operate the processor 21. The RF unit 23 is coupled with the processor 21 and transmits and/or receives a radio signal. The BS 10 and/or the UE 20 may have single antenna and multiple antennas. When at least one of the BS 10 and the UE 20 has multiple antennas, the wireless communication system may be called as multiple input multiple output (MIMO) system.

Component Carrier Aggregation in LTE-A

Figure 6:
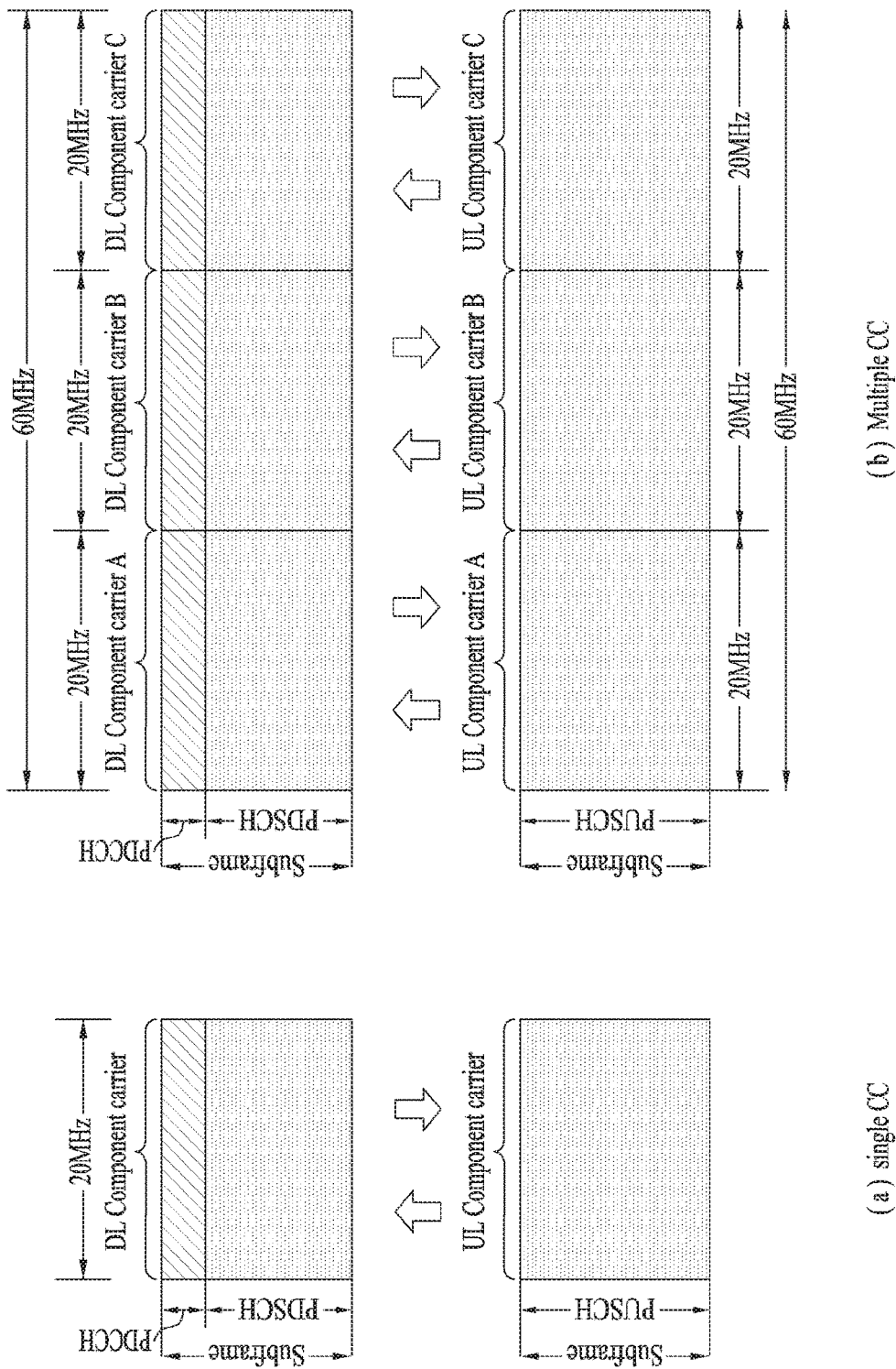
FIG. 6 illustrates subframe structure of 3GPP LTE Release-8 system and LTE-A system with CC aggregation.

FIG. 6 illustrates subframe structure of 3GPP LTE Release-8 system and LTE-A system with CC aggregation.

As the increased demands for the high data rate transmission, the mobile communication system composed of aggregated multiple CCs (component carriers) is now being researched. For example, FIG. 6 (b) illustrates the DL/UL subframe structure considered in 3GPP LTE-A (LTE Advanced) system where multiple CCs are aggregated (in this example, 3 carriers exist), while FIG. 6 (a) illustrates a single carrier operation as in conventional systems. As shown in FIG. 6 (b), a UE can monitor and receive DL signal/data from multiple DL CCs at the same time. However, even if a cell is managing N DL CCs, the network may configure a UE with M DL CCs where M≤N so that the UE's monitoring of the DL signal/data is limited to those M DL CCs. In addition, the network may configure L DL CCs as the main DL CCs from which the UE should monitor/receive DL signal/data with a priority, either UE-specifically or cell-specifically, where L≤M≤N. CC can be classified into Cell and can be expressed by equivalent concept.

Figure 7:
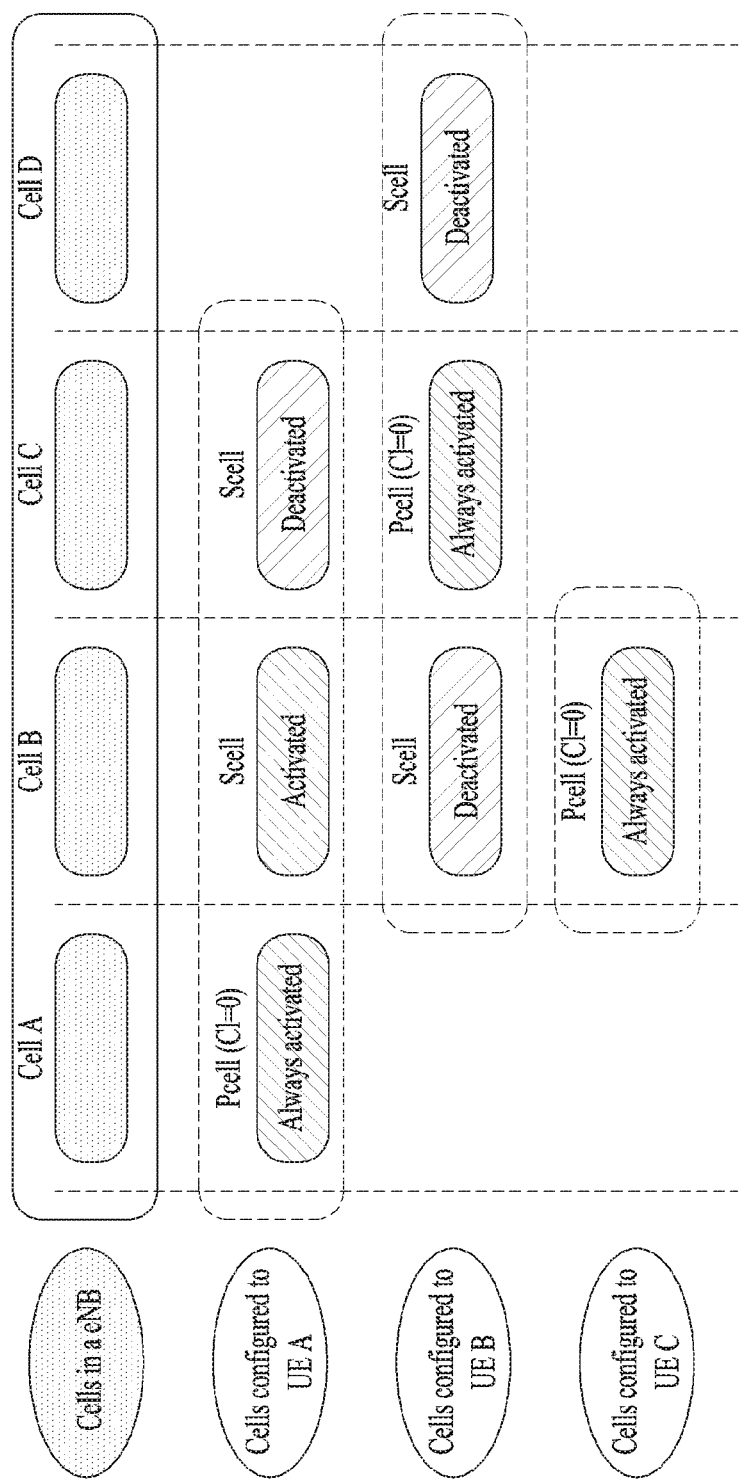
FIG. 7 illustrates configured cell, activated cell, de-activated cell.

FIG. 7 illustrates configured cell, activated cell, de-activated cell.

In a system supportive of carrier aggregation, as shown in FIG. 7, cells can be distinguished from each other. A configured cell, as shown in FIG. 7, corresponds to a cell configured to perform carrier aggregation based on a measurement report among cells of a base station. The configured cell is configured according to a UE. The configured cell makes a reservation for a resource for transmitting ACK/NACK for PDSCH transmission in advance. An activated cell corresponds to a cell configured to practically transmit PDSCH/PUSCH among the configured cells. The activated cell performs CSI report for PDSCH/PUSCH transmission and SRS transmission. A de-activated cell corresponds to a cell configured not to transmit PDSCH/PUSCH according to a command of a base station or a timer operation. In this case, CSI report and SRS transmission are also terminated according to the command of the base station or the timer operation.

PDCCH corresponds to a downlink control channel. The PDCCH is configured to transmit control information for transmitting PDSCH/PUSCH for a specific UE and transmit a power control command for a plurality of UEs. The PDCCH occupies maximum 4 OFDM symbols in time domain and PCFICH indicates the number of OFDM symbols assigned to the PDCCH. Meanwhile, the PDCCH is transmitted over system whole band in frequency domain and uses QPSK for modulation. A resource used for transmitting the PDCCH is referred to as a CCE (control channel element). Since the CCE consists of 36 resource elements, it may be able to transmit 72 bits via a single CCE. The amount of control information transmitted on the PDCCH may vary depending on a transmission mode. Control information according to a transmission mode is regulated by a DCI format. A UE determines whether or not PDSCH/PUSCH is transmitted according to a PDCCH decoding result. In this case, PDCCH scrambling is performed using UE ID information (C-RNTI) of a corresponding UE. In particular, if a UE detects a DCI format, which is transmitted in a manner of being scrambled by a UE ID of the UE, the UE transmits PUSCH or receives PDSCH according to PDCCH control information. In general, one subframe includes a plurality of PDCCHs capable of being transmitted. Hence, it is necessary for a UE to check whether or not there is control information transmitted to the UE by performing decoding on a plurality of the PDCCHs. However, if the UE performs decoding on all of a plurality of the PDCCHs, complexity is considerably increased. Hence, the number of performing decoding is limited. When control information is transmitted via PDCCH, the control information can be transmitted in a manner of one CCE or concatenating a plurality of CCEs with each other. This is referred to as CCE aggregation. Currently, a permitted CCE aggregation level is 1, 2, 4 and 8. If the CCE aggregation level corresponds to 4, it indicates that control information of a corresponding UE is transmitted in a manner of concatenating 4 CCEs with each other. A UE sets limit on the decoding number according to each aggregation level. Table 1 in the following shows the decoding number according to an aggregation level.

TABLE 1

PDCCH aggregation level and decoding number

| Type | Search space $S_k^{(L)}$ | | Number of PDCCH candidates $M^{(L)}$ |
|---|---|---|---|
| | Aggregation level L | Size [in CCEs] | |
| UE-specific | 1 | 6 | 6 |
| | 2 | 12 | 6 |
| | 4 | 8 | 2 |
| | 8 | 16 | 2 |
| Common | 4 | 16 | 4 |
| | 8 | 16 | 2 |

Referring to Table 1, in case of a common type, a UE performs decoding on PDCCHs, which are transmitted by an aggregation level 4 and 8, 4 times and 2 times, respectively, to determine whether or not control information is transmitted. A specific CCE constructing PDCCH corresponds to a region commonly known to all UEs. In case of a UE-specific type, unlike the common type, a UE performs decoding on PDCCHs, which are transmitted by an aggregation level 1, 2, 4, and 8, 6, 6, 2 and 2 times, respectively, to determine whether or not control information is transmitted. In this case, a CCE is differently configured according to a UE. This can be represented as equation 1 described in the following.

$$Y_k = (A \cdot Y_{k-1}) \bmod D \quad \text{[Equation 1]}$$

In this case, $Y_{-1} = n_{RNTI} \neq 0$, $A = 39827$, $D = 65537$ and $k = \lfloor n_s/2 \rfloor$. $n_s$ corresponds to a slot number in a radio frame.

Physical resource block (PRB) bundling: In case of a UE supporting a transmission mode 9, the UE can configure PMI/RI feedback via higher layer. The transmission mode 9 UE to which the PMI/RI feedback is configured may make an assumption on granularity of a physical resource block that applies the same precoding to PDSCH and a DM RS. In particular, the UE performs channel estimation under the assumption that the same precoding is applied to a precoding resource block group (PRG) according to a system bandwidth to enhance channel estimation capability. Table 2 in the following shows values of a PRG size according to a system bandwidth.

TABLE 2

PRG size according to system bandwidth

| System bandwidth ($N_{RB}^{DL}$) | PRO size (PRBs) |
|---|---|
| <=10 | 1 |
| 11~26 | 2 |
| 27~63 | 3 |
| 64~110 | 2 |

In a general communication system, in order to make a receiving end correct an error occurred at a channel, a transmitting end performs coding on information transmitted by the transmitting end using a forward error correction code and transmits the information. Having received the information, the receiving end performs demodulation on a reception signal, performs a decoding procedure on the error correction code, and restores the information. An error of the reception signal caused by a channel can be corrected by the decoding procedure. The error correction code may include various types. In the present invention, a turbo code is explained as an example of the error correction code. The turbo code consists of a recursive systematic convolution encoder and an interleaver. When the turbo code is actually implemented, an interleaver may exist to easily perform parallel decoding. QPP (quadratic polynomial permutation) is a sort of the interleaver. It is known as the QPP interleaver maintains good performance on a specific data block size only. It is known as the performance of the turbo code is getting better as a size of a data block is getting bigger. In an actual communication system, if a data block has a size equal to or greater than a prescribed size, the data block is divided into a plurality of small data blocks to easily perform encoding. A divided small data block is referred to as a code block. In general, code blocks have the same size. Yet, due to a size restriction of the QPP interleaver, one of a plurality of code blocks may have a different size. The error correction encoding procedure is performed in a unit of a determined interleaver size code block and interleaving is performed to reduce an impact of a burst error, which occurs when transmission is performed via a radio channel. The code block is transmitted in a manner of being mapped to an actual radio resource. Since the amount of radio resources used for performing actual transmission is constant, it is necessary to perform rate matching on the encoded code block to match with the amount of radio resource. In general, rate matching is performed by puncturing or repetition. The rate matching can be performed in such a unit of an encoded code block similar to WCDMA of 3GPP. As a different method, it may be able to separately perform the rate matching in a manner of dividing the encoded code block into a systematic part and a parity part.

Figure 8:
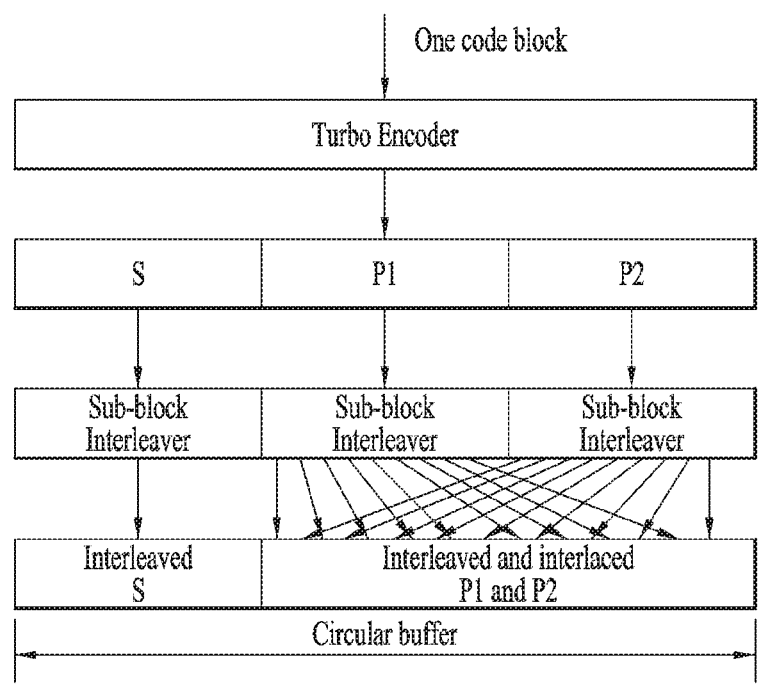
FIG. 8 illustrates rate matching block diagram.

FIG. 8 illustrates rate matching block diagram.

FIG. 8 corresponds to a block diagram for performing rate matching in a manner of dividing an encoded code block into a systematic part and a parity part. In this case, assume that a code rate corresponds to ⅓. In this case, a CRC for detecting an error is attached to a data block transmitted by higher layer. For clarity of implementation, a CRC is attached to a segmented code block as well. It is necessary to define various data block sizes according to a service type of higher layer. Yet, since it is necessary to signal the various data block sizes to a receiving end, quantization is required. When the quantization is performed, in order to match a size of a source data block transmitted by higher later with a size of a data block of a physical layer, a dummy bit is attached. When the quantization is performed, it is preferable to minimize the amount of attached dummy bits. A data block size, modulation and coding rate, and the number of allocated resources become functional relation with each other. In particular, one parameter is determined by values of other two parameters. Hence, in case of signaling parameters, it may signal two parameters only. In the following, for clarity, assume that modulation and coding rate and the number of allocated resources are used to inform a receiving end of a data block size. In this case, a pilot signal or a reference signal for channel estimation, a resource for transmitting control information, and the like may influence on the number of allocated resources according to an antenna configuration. A factor influencing on the number of allocated resources may change at every transmission instant.

Rate Matching

Figure 9:
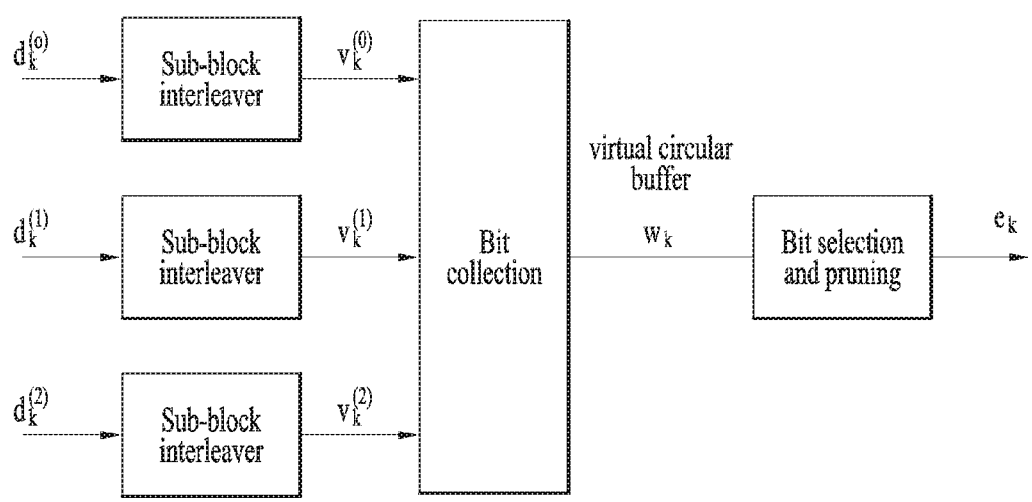
FIG. 9 illustrates rate matching for turbo coded transport channels.

FIG. 9 illustrates rate matching for turbo coded transport channels.

The rate matching for turbo coded transport channels is defined per coded block and consists of interleaving the three information bit streams $d_k^{(0)}$, $d_k^{(1)}$ and $d_k^{(2)}$, followed by the collection of bits and the generation of a circular buffer as depicted in FIG. 9. The output bits for each code block are transmitted as described in section 5.1.4.3.2 of 3GPP LTE TS 36.212 standard document.

The bit stream $d_k^{(0)}$ is interleaved according to the sub-block interleaver defined in section 5.1.4.3.1 of 3GPP LTE TS 36.212 standard document with an output sequence defined as $v_0^{(0)}, v_1^{(0)}, v_2^{(0)}, \ldots, v_{K_\Pi-1}^{(0)}$ and where K is defined in section 5.1.4.3.1 of 3GPP LTE TS 36.212 standard document. The bit stream $d_k^{(1)}$ is interleaved according to the sub-block interleaver defined in section 5.1.4.3.1 of 3GPP LTE TS 36.212 standard document with an output sequence defined as $v_0^{(1)}, v_1^{(1)}, v_2^{(1)}, \ldots, v_{K_\Pi-1}^{(1)}$. The bit stream $d_k^{(2)}$ is interleaved according to the sub-block interleaver defined in section 5.1.4.3.1 with an output sequence defined as $v_0^{(2)}, v_1^{(2)}, v_2^{(2)}, \ldots, v_{K_\Pi-1}^{(2)}$.

The sequence of bits $e_k$ for transmission is generated according to section 5.1.4.3.2 of 3GPP LTE TS 36.212 standard document.

Sub-Block Interleaver

The bits input to the block interleaver are denoted by $d_0^{(i)}, d_1^{(i)}, d_2^{(i)}, \ldots, d_{D-1}^{(i)}$, where D is the number of bits. The output bit sequence from the block interleaver is derived as follows:

(1) Assign $C_{subblock}^{TC}=32$ to be the number of columns of the matrix. The columns of the matrix are numbered 0, 1, 2, ..., $C_{subblock}^{TC}-1$ from left to right.

(2) Determine the number of rows of the matrix $C_{subblock}^{TC}$, by finding minimum integer $R_{subblock}^{TC}$ such that:

$$D \leq (R_{subblock}^{TC} \times C_{subblock}^{TC})$$

The rows of rectangular matrix are numbered 0, 1, 2, ..., $R_{subblock}^{TC}-1$ from top to bottom.

(3) If $(R_{subblock}^{TC} \times C_{subblock}^{TC}) > D$, then $N_D = (R_{subblock}^{TC} \times C_{subblock}^{TC} - D)$ dummy bits are padded such that $y_k = \text{<NULL>}$ for $k=0, 1, \ldots, N_D-1$. Then, $y_{N_D+k} = d_k^{(i)}$, $k=0, 1, \ldots, D-1$, and the bit sequence $y_k$ is written into the $(R_{subblock}^{TC} \times C_{subblock}^{TC})$ matrix row by row starting with bit $y_0$ in column 0 of row 0:

$$\begin{bmatrix} y_0 & y_1 & y_2 & \cdots & y_{C_{subblock}^{TC}-1} \\ y_{C_{subblock}^{TC}} & y_{C_{subblock}^{TC}+1} & y_{C_{subblock}^{TC}+2} & \cdots & y_{2C_{subblock}^{TC}-1} \\ \vdots & \vdots & \vdots & \ddots & \vdots \\ y_{(R_{subblock}^{TC}-1) \times C_{subblock}^{TC}} & y_{(R_{subblock}^{TC}-1) \times C_{subblock}^{TC}+1} & y_{(R_{subblock}^{TC}-1) \times C_{subblock}^{TC}+2} & \cdots & y_{(R_{subblock}^{TC} \times C_{subblock}^{TC}-1)} \end{bmatrix}$$

For $d_k^{(0)}$ and $d_k^{(1)}$:

(4) Perform the inter-column permutation for the matrix based on the pattern $\langle P(j) \rangle_{j \in \{0, 1, \ldots, C_{subblock}^{TC}-1\}}$ that is shown in table 3, where P(j) is the original column position of the j-th permuted column. After permutation of the columns, the inter-column permuted $(R_{subblock}^{TC} \times C_{subblock}^{TC})$ matrix is equal to $$\begin{bmatrix} y_{P(0)} & y_{P(1)} & y_{P(2)} & \cdots & y_{P(C_{subblock}^{TC}-1)} \\ y_{P(0)+C_{subblock}^{TC}} & y_{P(1)+C_{subblock}^{TC}} & y_{P(2)+C_{subblock}^{TC}} & \cdots & y_{P(C_{subblock}^{TC}-1)+C_{subblock}^{TC}} \\ \vdots & \vdots & \vdots & \ddots & \vdots \\ y_{P(0)+(R_{subblock}^{TC}-1) \times C_{subblock}^{TC}} & y_{P(1)+(R_{subblock}^{TC}-1) \times C_{subblock}^{TC}} & y_{P(2)+(R_{subblock}^{TC}-1) \times C_{subblock}^{TC}} & \cdots & y_{P(C_{subblock}^{TC}-1)+(R_{subblock}^{TC}-1) \times C_{subblock}^{TC}} \end{bmatrix}$$

(5) The output of the block interleaver is the bit sequence read out column by column from the inter-column permuted $(R_{subblock}^{TC} \times C_{subblock}^{TC})$ matrix. The bits after sub-block interleaving are denoted by $v_0^{(i)}, v_1^{(i)}, v_2^{(i)}, \ldots, v_{K_\Pi-1}^{(i)}$, where $v_0^{(i)}$ corresponds to $y_{P(0)}$, $v_1^{(i)}$ to $y_{P(0)+C_{subblock}^{TC}}$ ... and $K_\Pi = (R_{subblock}^{TC} = C_{subblock}^{TC})$.

For $d_k^{(2)}$:

(4) The output of the sub-block interleaver is denoted by $v_0^{(2)}, v_1^{(2)}, v_2^{(2)}, \ldots, v_{K_\Pi-1}^{(2)}$, where $v_k^{(2)} = y_{\pi(k)}$ and where $$\pi(k) = \left( P\left( \left\lfloor \frac{k}{R_{subblock}^{TC}} \right\rfloor \right) + C_{subblock}^{TC} \times (k \bmod R_{subblock}^{TC}) + 1 \right) \bmod K_\Pi$$

The permutation function P is defined in Table 3.

TABLE 3

Inter-column permutation pattern for sub-block interleaver.

| Number of columns $C_{subblock}^{TC}$ | Inter-column permutation pattern $<P(0), P(1), \ldots, P(C_{subblock}^{TC} - 1)$ |
|---|---|
| 32 | <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

Bit Collection, Selection and Transmission

The circular buffer of length $K_w=3K_\pi$ for the r-th coded block is generated as follows:

$w_k = v_k^{(0)}$ for $k=0, \ldots, K_\Pi-1$ $w_{K_\Pi 2k} = v_k^{(2)}$ for $k=0, \ldots, K_\Pi-1$ $w_{K_\Pi 2k+1} = v_k^{(2)}$ for $k=0, \ldots, K_\Pi-1$ Denote the soft buffer size for the transport block by $N_{IR}$ bits and the soft buffer size for the r-th code block by $N_{cb}$ bits. The size $N_{cb}$ is obtained as follows, where C is the number of code blocks computed in section 5.1.2:

$$-N_{cb} = \min\left(\left\lfloor \frac{N_{IR}}{C} \right\rfloor, K_w\right)$$

for DL-SCH transport channels
$N_{cb}=K_w$ for UL-SCH transport channels
where $N_{IR}$ is equal to:

$$N_{IR} = \left\lfloor \frac{N_{soft}}{K_C \cdot K_{MIMO} \cdot \min(M_{DL\_HARQ}, M_{limit})} \right\rfloor$$

where:
$N_{soft}$ is the total number of soft channel bits [FFS].
$K_{MIMO}$ is equal to 2 if [FFS condition], and is equal to 1 otherwise.
$M_{DL\_HARQ}$ is the maximum number of DL HARQ processes as defined in section 7 of [3].
$M_{limit}$ is a constant equal to [FFS].
Denoting by E the rate matching output sequence length for the r-th coded block, and $rv_{idx}$ the redundancy version number for this transmission ($rv_{idx}=0, 1, 2$ or 3), the rate matching output bit sequence is $e_k$, $k=0, 1, \ldots, E-1$.
Define by G the total number of bits available for the transmission of one transport block.
Set $G'=G/(N_L \cdot Q_m)$ where $Q_m$, is equal to 2 for QPSK, 4 for 16QAM, 6 for 64QAM, and where
For transmit diversity:
$N_L$ is equal to 2,
Otherwise:
$N_L$ is equal to the number of layers a transport block is mapped onto Set $\gamma=G'$ mod C, where C is the number of code blocks computed in section 5.1.2.
if $r \leq C-\gamma-1$
   set $E=N_L \cdot Q_m \cdot \lfloor G'/C \rfloor$
else
   set $E=N_L \cdot Q_m \cdot \lceil G'/C \rceil$
end if
Set $$k_0 = R_{subblock}^{TC} \cdot \left(2 \cdot \left\lceil \frac{N_{cb}}{8R_{subblock}^{TC}} \right\rceil \cdot rv_{idx} + 2\right),$$

where $R_{subblock}^{TC}$ is the number of rows defined in section 5.1.4.1.1.
Set k=0 and j=0
while {k<E}
   if $w_{(k_0+j) \bmod N_{cb}} \neq$ <NULL>
   $e_k = w_{(k_0+j) \bmod N_{cb}}$
   k=k+1
   end if
   j=j+1
end while LDPC Coding The K bits including filler bits ($c_0, c_1, c_2, \ldots, c_{K-1}$) are encoded based on D-K by D parity check matrix (H), where D is number of encoded bits and D-K is the number of parity check bits. The parity check bits ($p_0, p_1, p_2, \ldots, p_{D-K-1}$) are obtained so that $H \cdot d^T = 0$, where $d=(c_0, c_1, c_2, \ldots, c_{K-1}, p_0, p_1, p_2, \ldots, p_{D-K-1})$ is coded bits stream.

The parity check matrix H is defined as:

$$\begin{bmatrix} P^{a_{0,0}} & P^{a_{0,1}} & P^{a_{0,2}} & & P^{a_{0,N_{ldpc\_b}-2}} & P^{a_{0,N_{ldpc\_b}-1}} \\ P^{a_{1,0}} & P^{a_{1,1}} & P^{a_{1,2}} & \ldots & P^{a_{1,N_{ldpc\_b}-2}} & P^{a_{1,N_{ldpc\_b}-1}} \\ P^{a_{2,0}} & P^{a_{2,1}} & P^{a_{2,2}} & & P^{a_{2,N_{ldpc\_b}-2}} & P^{a_{2,N_{ldpc\_b}-1}} \\ & & \vdots & \ddots & \vdots & \\ P^{a_{N_{parity\_b}-1,0}} & P^{a_{N_{parity\_b}-1,1}} & P^{a_{N_{parity\_b}-1,2}} & \ldots & P^{a_{N_{parity\_b}-1,N_{ldpc\_b}-2}} & P^{a_{N_{parity\_b}-1,N_{ldpc\_b}-1}} \end{bmatrix}$$

where $P^{a_{ij}}$ ($0 \leq i < N_{parity\_b}, 0 \leq j < N_{ldpc\_b}$) is zero matrix (when $a_{ij}=-1$) or cyclic-permutation matrix obtained from the Z by Z identity matrix by cyclically shifted the columns to the right by $a_{ij}$ elements. The value of Z is shift size obtained by $Z=\lceil K/K_{min} \rceil \cdot 27$ where $K_{min}$ is given in Table 5.1.2-1.
The matrix $P^{a_{ij}}$ is Z by Z zero matrix when $a_{ij}$ is −1. The codeword length D, information length K and number of parity bits D-K is equal to $N_{ldpc\_b} \times Z$, $K_{ldpc\_b} \times Z$ and $N_{pairty\_b} \times Z$, respectively. The parameters $N_{ldpc\_b}$, $K_{ldpc\_b}$ and $N_{parity\_b}$ according to code rates are depicted in Table 3.

TABLE 3

Parameters of parity check matrix

| Code Rate | $N_{ldpc\_b}$ | $K_{ldpc\_b}$ | $N_{parity\_b}$ |
|---|---|---|---|
| 5/6 | 24 | 20 | 4 |
| 3/4 | 24 | 18 | 6 |
| 2/3 | 24 | 16 | 8 |
| 1/2 | 24 | 12 | 12 |

The parity check matrix is obtained based on Tables 5.1.3.2-2, 5.1.3.2-3, 5.1.3.2-4 and 5.1.3.2-5 which show the exponents ($a_{ij}$) of parity check matrix when the code rate equals 5/6, 3/4, 2/3 and 1/2 for each encoded bits, respectively [5].

TABLE 4

Matrix exponents for Code rate R = 5/6

(a) D = 648 bits, Z = 27 bits

| | | | | | | | | | | | |
|---|---|---|---|---|---|---|---|---|---|---|---|
| 17 | 13 | 8 | 21 | 9 | 3 | 18 | 12 | 10 | 0 | 4 | 15 | 19 |
| 2 | 5 | 10 | 26 | 19 | 13 | 13 | 1 | 0 | -1 | -1 | |
| 3 | 12 | 11 | 14 | 11 | 25 | 5 | 18 | 0 | 9 | 2 | 26 | 26 |
| 10 | 24 | 7 | 14 | 20 | 4 | 2 | -1 | 0 | 0 | -1 | |
| 22 | 16 | 4 | 3 | 10 | 21 | 12 | 5 | 21 | 14 | 19 | 5 | -1 |
| 8 | 5 | 18 | 11 | 5 | 5 | 15 | 0 | -1 | 0 | 0 | |
| 7 | 7 | 14 | 14 | 4 | 16 | 16 | 24 | 24 | 10 | 1 | 7 | 15 |
| 6 | 10 | 26 | 8 | 18 | 21 | 14 | 1 | -1 | -1 | 0 | |

(b) D = 1296 bits, Z = 54 bits

| | | | | | | | | | | | |
|---|---|---|---|---|---|---|---|---|---|---|---|
| 48 | 29 | 37 | 52 | 2 | 16 | 6 | 14 | 53 | 31 | 34 | 5 | 18 |
| 42 | 53 | 31 | 45 | -1 | 46 | 52 | 1 | 0 | -1 | -1 | |
| 17 | 4 | 30 | 7 | 43 | 11 | 24 | 6 | 14 | 21 | 6 | 39 | 17 |
| 40 | 47 | 7 | 15 | 41 | 19 | -1 | -1 | 0 | 0 | -1 | |
| 7 | 2 | 51 | 31 | 46 | 23 | 16 | 11 | 53 | 40 | 10 | 7 | 46 |
| 53 | 33 | 35 | -1 | 25 | 35 | 38 | 0 | -1 | 0 | 0 | |
| 19 | 48 | 41 | 1 | 10 | 7 | 36 | 47 | 5 | 29 | 52 | 52 | 31 |
| 10 | 26 | 6 | 3 | 2 | -1 | 51 | 1 | -1 | -1 | 0 | |

(c) D = 1944 bits, Z = 81 bits

| | | | | | | | | | | | |
|---|---|---|---|---|---|---|---|---|---|---|---|
| 13 | 48 | 80 | 66 | 4 | 74 | 7 | 30 | 76 | 52 | 37 | 60 | -1 |
| 49 | 73 | 31 | 74 | 73 | 23 | -1 | 1 | 0 | -1 | -1 | |
| 69 | 63 | 74 | 56 | 64 | 77 | 57 | 65 | 6 | 16 | 51 | -1 | 64 |
| -1 | 68 | 9 | 48 | 62 | 54 | 27 | -1 | 0 | 0 | -1 | |
| 51 | 15 | 0 | 80 | 24 | 25 | 42 | 54 | 44 | 71 | 71 | 9 | 67 |
| 35 | -1 | 58 | -1 | 29 | -1 | 53 | 0 | -1 | 0 | 0 | |
| 16 | 29 | 36 | 41 | 44 | 56 | 59 | 37 | 50 | 24 | -1 | 65 | 4 |
| 65 | 52 | -1 | 4 | -1 | 73 | 52 | 1 | -1 | -1 | 0 | |

TABLE 5

Matrix exponents for Code rate R = 3/4

(a) D = 648 bits, Z = 27 bits

| | | | | | | | | | | | |
|---|---|---|---|---|---|---|---|---|---|---|---|
| 16 | 17 | 22 | 24 | 9 | 3 | 14 | -1 | 4 | 2 | 7 | -1 | 26 |
| -1 | 2 | -1 | 21 | -1 | 1 | 0 | -1 | -1 | -1 | -1 | |
| 25 | 12 | 12 | 3 | 3 | 26 | 6 | 21 | -1 | 15 | 22 | -1 | 15 |
| -1 | 4 | -1 | -1 | 16 | -1 | 0 | 0 | -1 | -1 | -1 | |
| 25 | 18 | 26 | 16 | 22 | 23 | 9 | -1 | 0 | -1 | 4 | -1 | 4 |
| -1 | 8 | 23 | 11 | -1 | -1 | -1 | 0 | 0 | -1 | -1 | |
| 9 | 7 | 0 | 1 | 17 | -1 | -1 | 7 | 3 | -1 | 3 | 23 | -1 |
| 16 | -1 | -1 | 21 | -1 | 0 | -1 | -1 | 0 | 0 | -1 | |
| 24 | 5 | 26 | 7 | 1 | -1 | -1 | 15 | 24 | 15 | -1 | 8 | -1 |
| 13 | -1 | 13 | -1 | 11 | -1 | -1 | -1 | -1 | 0 | 0 | |
| 2 | 2 | 19 | 14 | 24 | 1 | 15 | 19 | -1 | 21 | -1 | 2 | -1 |
| 24 | -1 | 3 | -1 | 2 | 1 | -1 | -1 | -1 | -1 | 0 | |

(b) D = 1296 bits, Z = 54 bits

| | | | | | | | | | | | |
|---|---|---|---|---|---|---|---|---|---|---|---|
| 39 | 40 | 51 | 41 | 3 | 29 | 8 | 36 | -1 | 14 | -1 | 6 | -1 |
| 33 | -1 | 11 | -1 | 4 | 1 | 0 | -1 | -1 | -1 | -1 | |
| 48 | 21 | 47 | 9 | 48 | 35 | 51 | -1 | 38 | -1 | 28 | -1 | 34 |
| -1 | 50 | -1 | 50 | -1 | 50 | -1 | 0 | -1 | -1 | -1 | |
| 30 | 39 | 28 | 42 | 50 | 39 | 5 | 17 | -1 | 6 | -1 | 18 | -1 |
| 20 | -1 | 15 | -1 | 40 | -1 | -1 | 0 | 0 | -1 | -1 | |
| 29 | 0 | 1 | 43 | 36 | 30 | 47 | -1 | 49 | -1 | 47 | -1 | 3 |
| -1 | 35 | -1 | 34 | -1 | 0 | -1 | -1 | 0 | 0 | -1 | |
| 1 | 32 | 11 | 23 | 10 | 44 | 12 | 7 | -1 | 48 | -1 | 4 | -1 |
| 9 | -1 | 17 | -1 | 16 | -1 | -1 | -1 | -1 | 0 | 0 | |
| 13 | 7 | 15 | 47 | 23 | 16 | 47 | -1 | 43 | -1 | 29 | -1 | 52 |
| -1 | 2 | -1 | 53 | -1 | 1 | -1 | -1 | -1 | -1 | 0 | |

(c) D = 1944 bits, Z = 81 bits

| | | | | | | | | | | | |
|---|---|---|---|---|---|---|---|---|---|---|---|
| 48 | 29 | 28 | 39 | 9 | 61 | -1 | -1 | -1 | 63 | 45 | 80 | -1 |
| -1 | -1 | 37 | 32 | 22 | 1 | 0 | -1 | -1 | -1 | -1 | |
| 4 | 49 | 42 | 48 | 11 | 30 | -1 | -1 | -1 | 49 | 17 | 41 | 37 |

TABLE 5-continued

Matrix exponents for Code rate R = 3/4

| | | | | | | | | | | | |
|---|---|---|---|---|---|---|---|---|---|---|---|
| | 15 | -1 | 54 | -1 | -1 | -1 | 0 | 0 | -1 | -1 | -1 |
| 35 | 76 | 78 | 51 | 37 | 35 | 21 | -1 | 17 | 64 | -1 | -1 | -1 |
| 59 | 7 | -1 | -1 | 32 | -1 | -1 | 0 | 0 | -1 | -1 | |
| 9 | 65 | 44 | 9 | 54 | 56 | 73 | 34 | 42 | -1 | -1 | -1 | 35 |
| -1 | -1 | -1 | 46 | 39 | 0 | -1 | -1 | 0 | 0 | -1 | |
| 3 | 62 | 7 | 80 | 68 | 26 | -1 | 80 | 55 | -1 | 36 | -1 | 26 |
| -1 | 9 | -1 | 72 | -1 | -1 | -1 | -1 | -1 | 0 | 0 | |
| 26 | 75 | 33 | 21 | 69 | 59 | 3 | 38 | -1 | -1 | -1 | 35 | -1 |
| 62 | 36 | 26 | -1 | -1 | 1 | -1 | -1 | -1 | -1 | 0 | |

TABLE 6

Matrix exponents for Code rate R = 2/3

(a) D = 648 bits, Z = 27 bits

| | | | | | | | | | | | |
|---|---|---|---|---|---|---|---|---|---|---|---|
| 25 | 26 | 14 | -1 | 20 | -1 | 2 | -1 | 4 | -1 | -1 | 8 | -1 |
| 16 | -1 | 18 | 1 | 0 | -1 | -1 | -1 | -1 | -1 | -1 | |
| 10 | 9 | 15 | 11 | -1 | 0 | -1 | 1 | -1 | -1 | 18 | -1 | 8 |
| -1 | 10 | -1 | -1 | 0 | 0 | -1 | -1 | -1 | -1 | -1 | |
| 16 | 2 | 20 | 26 | 21 | -1 | 6 | -1 | 1 | 26 | -1 | 7 | -1 |
| -1 | -1 | -1 | -1 | -1 | 0 | 0 | -1 | -1 | -1 | -1 | |
| 10 | 13 | 5 | 0 | -1 | 3 | -1 | 7 | -1 | -1 | 26 | -1 | -1 |
| 13 | -1 | 16 | -1 | -1 | -1 | 0 | 0 | -1 | -1 | -1 | |
| 23 | 14 | 24 | -1 | 12 | -1 | 19 | -1 | 17 | -1 | -1 | -1 | 20 |
| -1 | 21 | -1 | 0 | -1 | -1 | 0 | 0 | -1 | -1 | -1 | |
| 6 | 22 | 9 | 20 | -1 | 25 | -1 | 17 | -1 | 8 | -1 | 14 | -1 |
| 18 | -1 | -1 | -1 | -1 | -1 | -1 | -1 | 0 | 0 | -1 | |
| 14 | 23 | 21 | 11 | 20 | -1 | 24 | -1 | 18 | -1 | 19 | -1 | -1 |
| -1 | -1 | 22 | -1 | -1 | -1 | -1 | -1 | -1 | 0 | 0 | |
| 17 | 11 | 11 | 20 | -1 | 21 | -1 | 26 | -1 | 3 | -1 | -1 | 18 |
| -1 | 26 | -1 | 1 | -1 | -1 | -1 | -1 | -1 | -1 | 0 | |

(b) D = 1296 bits, Z = 54 bits

| | | | | | | | | | | | |
|---|---|---|---|---|---|---|---|---|---|---|---|
| 39 | 31 | 22 | 43 | -1 | 40 | 4 | -1 | 11 | -1 | -1 | 50 | -1 |
| -1 | -1 | 6 | 1 | 0 | -1 | -1 | -1 | -1 | -1 | -1 | |
| 25 | 52 | 41 | 2 | 6 | -1 | 14 | -1 | 34 | -1 | -1 | -1 | 24 |
| -1 | 37 | -1 | -1 | 0 | 0 | -1 | -1 | -1 | -1 | -1 | |
| 43 | 31 | 29 | 0 | 21 | -1 | 28 | -1 | -1 | 2 | -1 | -1 | 7 |
| -1 | 17 | -1 | -1 | -1 | 0 | 0 | -1 | -1 | -1 | -1 | |
| 20 | 33 | 48 | -1 | 4 | 13 | -1 | 26 | -1 | -1 | 22 | -1 | -1 |
| 46 | 42 | -1 | -1 | -1 | -1 | 0 | 0 | -1 | -1 | -1 | |
| 45 | 7 | 18 | 51 | 12 | 25 | -1 | -1 | -1 | 50 | -1 | -1 | 5 |
| -1 | -1 | -1 | 0 | -1 | -1 | -1 | 0 | 0 | -1 | -1 | |
| 35 | 40 | 32 | 16 | 5 | -1 | -1 | 18 | -1 | -1 | 43 | 51 | -1 |
| 32 | -1 | -1 | -1 | -1 | -1 | -1 | -1 | 0 | 0 | -1 | |
| 9 | 24 | 13 | 22 | 28 | -1 | -1 | 37 | -1 | 25 | -1 | -1 | -1 |
| 52 | -1 | 13 | -1 | -1 | -1 | -1 | -1 | -1 | 0 | 0 | |
| 32 | 22 | 4 | 21 | 16 | -1 | -1 | -1 | 27 | 28 | -1 | 38 | -1 |
| -1 | -1 | 8 | 1 | -1 | -1 | -1 | -1 | -1 | -1 | 0 | |

(c) D = 1944 bits, Z = 81 bits

| | | | | | | | | | | | |
|---|---|---|---|---|---|---|---|---|---|---|---|
| 61 | 75 | 4 | 63 | 56 | -1 | -1 | -1 | -1 | -1 | -1 | 8 | -1 |
| 2 | 17 | 25 | 1 | 0 | -1 | -1 | -1 | -1 | -1 | -1 | |
| 56 | 74 | 77 | 20 | -1 | -1 | -1 | 64 | 24 | 4 | 67 | -1 | 7 |
| -1 | -1 | -1 | -1 | 0 | 0 | -1 | -1 | -1 | -1 | -1 | |
| 28 | 21 | 68 | 10 | 7 | 14 | 65 | -1 | -1 | -1 | 23 | -1 | -1 |
| -1 | 75 | -1 | -1 | -1 | 0 | 0 | -1 | -1 | -1 | -1 | |
| 48 | 38 | 43 | 78 | 76 | -1 | -1 | -1 | -1 | 5 | 36 | -1 | 15 |
| 72 | -1 | -1 | -1 | -1 | -1 | 0 | 0 | -1 | -1 | -1 | |
| 40 | 2 | 53 | 25 | -1 | 52 | 62 | -1 | 20 | -1 | -1 | 44 | -1 |
| -1 | -1 | -1 | 0 | -1 | -1 | -1 | 0 | 0 | -1 | -1 | |
| 69 | 23 | 64 | 10 | 22 | -1 | 21 | -1 | -1 | -1 | -1 | -1 | 68 |
| 23 | 29 | -1 | -1 | -1 | -1 | -1 | -1 | 0 | 0 | -1 | |
| 12 | 0 | 68 | 20 | 55 | 61 | -1 | 40 | -1 | -1 | -1 | 52 | -1 |
| -1 | -1 | 44 | -1 | -1 | -1 | -1 | -1 | -1 | 0 | 0 | |
| 58 | 8 | 34 | 64 | 78 | -1 | -1 | 11 | 78 | 24 | -1 | -1 | -1 |
| -1 | -1 | 58 | 1 | -1 | -1 | -1 | -1 | -1 | -1 | 0 | |

TABLE 7

Matrix exponents for Code rate R = 1/2

(a) D = 648 bits, Z = 27 bits

```
 0 -1 -1 -1  0  0 -1 -1  0 -1 -1  0  1
 0 -1 -1 -1 -1 -1 -1 -1 -1 -1 -1
22  0 -1 -1 17 -1  0  0 12 -1 -1 -1 -1
 0  0 -1 -1 -1 -1 -1 -1 -1 -1 -1
 6 -1  0 -1 10 -1 -1 -1 24 -1  0 -1 -1
-1  0  0 -1 -1 -1 -1 -1 -1 -1 -1
 2 -1 -1  0 20 -1 -1 -1 25  0 -1 -1 -1
-1 -1  0  0 -1 -1 -1 -1 -1 -1 -1
23 -1 -1 -1  3 -1 -1 -1  0 -1  9 11 -1
-1 -1 -1  0  0 -1 -1 -1 -1 -1 -1
24 -1 23  1 17 -1  3 -1 10 -1 -1 -1 -1
-1 -1 -1 -1  0  0 -1 -1 -1 -1 -1
25 -1 -1 -1  8 -1 -1 -1  7 18 -1 -1  0
-1 -1 -1 -1 -1  0  0 -1 -1 -1 -1
13 24 -1 -1  0 -1  8 -1  6 -1 -1 -1 -1
-1 -1 -1 -1 -1 -1  0  0 -1 -1 -1
 7 20 -1 16 22 10 -1 -1 23 -1 -1 -1 -1
-1 -1 -1 -1 -1 -1 -1  0  0 -1 -1
11 -1 -1 -1 19 -1 -1 -1 13 -1  3 17 -1
-1 -1 -1 -1 -1 -1 -1 -1  0  0 -1
25 -1  8 -1 23 18 -1 14  9 -1 -1 -1 -1
-1 -1 -1 -1 -1 -1 -1 -1 -1  0  0
 3 -1 -1 -1 16 -1 -1  2 25  5 -1 -1  1
-1 -1 -1 -1 -1 -1 -1 -1 -1 -1  0
```

(b) D = 1296 bits, Z = 54 bits

```
40 -1 -1 -1 22 -1 49 23 43 -1 -1 -1  1
 0 -1 -1 -1 -1 -1 -1 -1 -1 -1 -1
50  1 -1 -1 48 35 -1 -1 13 -1 30 -1 -1
 0  0 -1 -1 -1 -1 -1 -1 -1 -1 -1
39 50 -1 -1  4 -1  2 -1 -1 -1 -1 49 -1
-1  0  0 -1 -1 -1 -1 -1 -1 -1 -1
33 -1 -1 38 37 -1 -1  4  1 -1 -1 -1 -1
-1 -1  0  0 -1 -1 -1 -1 -1 -1 -1
45 -1 -1 -1  0 22 -1 -1 20 42 -1 -1 -1
-1 -1 -1  0  0 -1 -1 -1 -1 -1 -1
51 -1 -1 48 35 -1 -1 -1 44 -1 18 -1 -1
-1 -1 -1 -1  0  0 -1 -1 -1 -1 -1
47 11 -1 -1 -1 17 -1 -1 51 -1 -1 -1  0
-1 -1 -1 -1 -1  0  0 -1 -1 -1 -1
 5 -1 25 -1  6 -1 45 -1 13 40 -1 -1 -1
-1 -1 -1 -1 -1 -1  0  0 -1 -1 -1
33 -1 -1 34 24 -1 -1 -1 23 -1 -1 46 -1
-1 -1 -1 -1 -1 -1 -1  0  0 -1 -1
 1 -1 27 -1  1 -1 -1 -1 38 -1 44 -1 -1
-1 -1 -1 -1 -1 -1 -1 -1  0  0 -1
-1 18 -1 -1 23 -1 -1  8  0 35 -1 -1 -1
-1 -1 -1 -1 -1 -1 -1 -1 -1  0  0
49 -1 17 -1 30 -1 -1 -1 34 -1 -1 19  1
-1 -1 -1 -1 -1 -1 -1 -1 -1 -1  0
```

(c) D = 1944 bits, Z = 81 bits

```
57 -1 -1 -1 50 -1 11 -1 50 -1 79 -1  1
 0 -1 -1 -1 -1 -1 -1 -1 -1 -1 -1
 3 -1 28 -1  0 -1 -1 -1 55  7 -1 -1 -1
 0  0 -1 -1 -1 -1 -1 -1 -1 -1 -1
30 -1 -1 -1 24 37 -1 -1 56 14 -1 -1 -1
-1  0  0 -1 -1 -1 -1 -1 -1 -1 -1
62 53 -1 -1 53 -1 -1  3 35 -1 -1 -1 -1
-1 -1  0  0 -1 -1 -1 -1 -1 -1 -1
40 -1 -1 20 66 -1 -1 22 28 -1 -1 -1 -1
-1 -1 -1  0  0 -1 -1 -1 -1 -1 -1
 0 -1 -1 -1  8 -1 42 -1 50 -1 -1  8 -1
-1 -1 -1 -1  0  0 -1 -1 -1 -1 -1
69 79 79 -1 -1 -1 56 -1 52 -1 -1 -1  0
-1 -1 -1 -1 -1  0  0 -1 -1 -1 -1
65 -1 -1 -1 38 57 -1 -1 72 -1 27 -1 -1
-1 -1 -1 -1 -1 -1  0  0 -1 -1 -1
64 -1 -1 -1 14 52 -1 -1 30 -1 -1 32 -1
-1 -1 -1 -1 -1 -1 -1  0  0 -1 -1
-1 45 -1 70  0 -1 -1 -1 77  9 -1 -1 -1
-1 -1 -1 -1 -1 -1 -1 -1  0  0 -1
 2 56 -1 57 35 -1 -1 -1 -1 -1 12 -1 -1
-1 -1 -1 -1 -1 -1 -1 -1 -1  0  0
24 -1 61 -1 60 -1 -1 27 51 -1 -1 16  1
-1 -1 -1 -1 -1 -1 -1 -1 -1 -1  0
```

When an LDPC code is introduced, if an encoder is designed without a restriction on a payload size, it is unable to satisfy required performance due to such a restriction as processing capability of a receiver, performance gain, decoding latency, and the like. Hence, it may be efficient to perform encoding in a manner of segmenting a payload size equal to or greater than a specific threshold value into a plurality of code blocks less than the threshold value.

Figure 10:
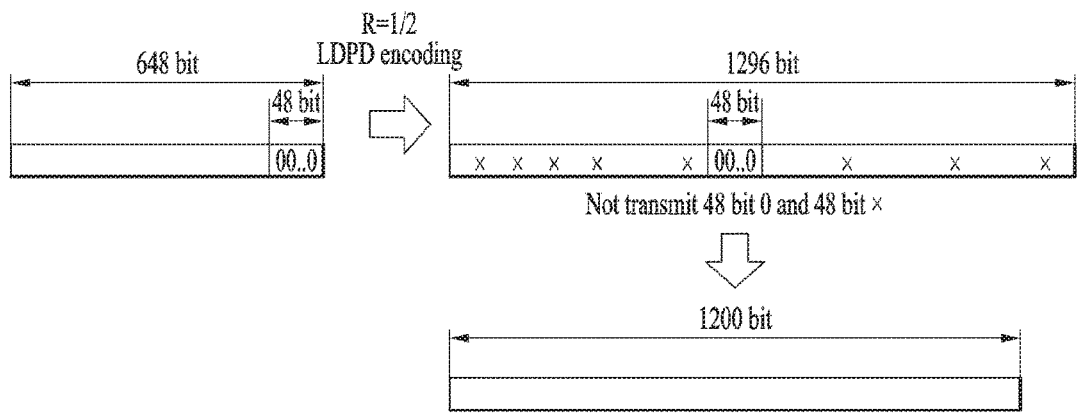
FIG. 10 illustrates an example of supporting various payload sizes using shortening/puncturing.

As mentioned in the foregoing description, an LDPC encoder may be defined by a parity check matrix (H). In other words, H matrix can be defined for an information bit length D and a coding rate r. Since the encoded bit length D is defined by 648, 1296, and 1944 bits and the coding rate (=payload size/codeword size) is defined by 5/6, 3/4, 2/3, and 1/2, 12 H matrixes are defined by a combination of (D, r). A payload size K supported by the 12 H matrixes can be calculated by an equation of D*r and supports payload sizes of {324, 432, 486, 540, 648, 864, 972, 989, 1080, 1319, 1484, 1648} bits. LDPC coding for an undefined encoded bit length can be supported using such a method as shortening and puncturing. For example, in case of performing 1/2 LDPC encoding on a payload size of 600 bits, the D becomes 1200 bits. In this case, since the r corresponds to 1/2, H matrix of a combination of (1296, 1/2) is used. In this case, if 48 bits among information bit 648 bits are set to 0, since it is a systematic structure, 48 bits of encoded bits become 0 and puncturing is performed on 48 bits among the remaining 1248 bits to generate 1200 bits. FIG. 10 shows the abovementioned procedure.

FIG. 10 illustrates an example of supporting various payload sizes using shortening/puncturing.

As mentioned in the foregoing description, if M (=M1× M2) number of H matrixes is defined, it indicates that M number of (D, r) or (K, r) combinations is supported. In order to support other code rates and payload sizes, it is necessary to perform a rate matching procedure such as shortening/puncturing/repetition. In this case, assume that D or K and r supports M1 number of H matrixes and M2 number of H matrixes, respectively. When the finite number of H matrixes is defined, the present invention proposes a method of segmenting a payload size greater than a specific threshold into a plurality of code blocks. After the code block segmentation is performed, a CRC can be attached to a code block. In general, since encoding is performed in a code block unit, it is preferable to have the same code block size. Yet, in case of performing shortening/puncturing/repetition, since it may have considerable performance deterioration, it may be able to perform code block segmentation using different code block sizes.

Figure 11:
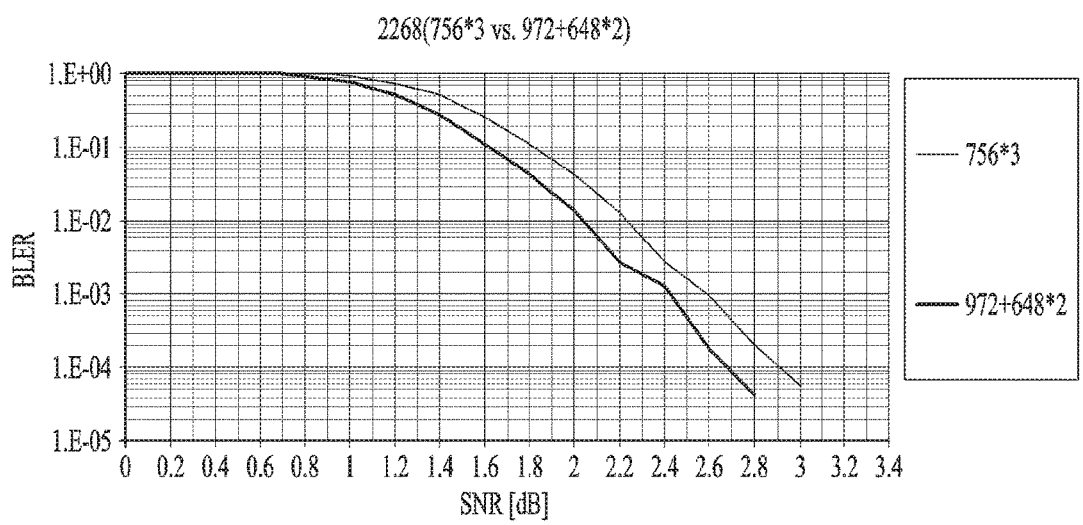
FIG. 11 illustrates performance comparison between segmentation using the same code block and segmentation using a different code block for an LDPC encoder.

FIG. 11 illustrates performance comparison between segmentation using the same code block size and segmentation using different code block sizes for an LDPC encoder.

In this case, assume that a payload size is 2268 bits under the assumption that code block segmentation is performed when a payload size is equal to or greater than 1648 bits. The 2268 bits can be segmented into 3 code blocks of the same size (756 bits) or can be segmented into 1 code block of a payload size of 972 bits and 2 code blocks of a payload size of 648 bits. In this case, the 756 bits can be encoded via shortening while using H matrix for the 972 bits. As shown in FIG. 11, when segmentation is performed with a code block size among payload sizes supporting H matrix, it may have good performance. It may consider a code block segmentation scheme described in the following based on the performance result shown in FIG. 11.

It is preferable that segmentation is performed to minimize the number of segmented code blocks.
  (1) As a length of a code block is longer, performance is better. Hence, segmentation is performed to make a code block length to be maximized
  (2) Since a CB CRC is attached to every code block, overhead can be increased (e.g., LTE Turbo code). Yet, in case of using an LDPC code, the CB CRC can be replaced with a syndrome check.
  It is preferable to perform segmentation using a payload size supported by H matrix. In this case, the H matrix may vary depending on a code rate. Hence, when code block segmentation is performed, it is preferable to consider a code rate capable of being obtained from control information. When a code rate $r_t$ used for actual transmission satisfies $r_n \leq r_t < r_{n+1}$, n=1, ... , M2, it is preferable to perform segmentation using a payload size supported by H matrix corresponding to a code rate selected from among $r_n$, $r_{n+1}$ based on a specific reference.
  (1): Segmentation is performed using the same code block size supported by H matrix.
  (1)-1: When a payload (=transport block) size is defined, it may be able to define a code block of a size supported by H matrix. It may be able to represent as $K+CRC_{TB}=N*(K_n+CRC_{CB})$, n=1, ... , M. In this case, $CRC_{TB}$ and $CRC_{TB}$ correspond to a CRC length attached to a transport block and a CRC length attached a code block, respectively. N corresponds to the number of segmented code blocks.
  (2): When segmentation is performed using the same code block size, in case of a payload size not supported by H matrix, the segmentation can be performed using different code block sizes supported by the H matrix. In this case, it is preferable to minimize the number of code blocks of the different size. For example, the number can be restricted to 2 or 3.
  (2)-1: When a payload (=transport block) size is defined, it may be able to define the sum of code blocks of different sizes supported by H matrix. In this case, it may be able to represent as $K+CRC_{TB}=N1*(K_{n1}+CRC_{CB})+N2*(K_{n2}+CRC_{CB})$, n1, n2=1, ... , M in consideration of 2 code blocks of a different size. In this case, $CRC_{TB}$ and $CRC_{CB}$ correspond to a CRC length attached to a transport block and a CRC length attached to a code block, respectively. N1 and N2 correspond to the number of code blocks segmented by a size of Kn1 and the number of code blocks segmented by a size of Kn2, respectively.
  (3) When segmentation is not performed using different payload sizes supported by H matrix, the segmentation is performed using a code block corresponding to the sum of sizes of segmented code blocks closest to a payload size. In this case, number of payload bits corresponding to a difference between the sum of size of segmented code blocks and the payload size can be processed as follows.
  Method 1: the payload bits are allocated to a specific code block and a codeword length is matched by performing rate matching such as shortening/puncturing/repetition.
    Method 1-1: When segmentation is performed using code blocks of different sizes, the payload bits are allocated to a code block among code blocks corresponding to a specific code block size.
    Method 1-2: When segmentation is performed using code blocks of different sizes, the payload bits are evenly allocated to all code blocks corresponding to a specific code block size.
  Method 2: The payload bits are evenly allocated to all code blocks and a codeword length is matched by performing rate matching such as shortening/puncturing/repetition.
    Method 2-1: The number of bits, which is allocated per a code block, is allocated in proportion to the number of code blocks and each bit is allocated to a specific code block of each code block size.
    Method 2-2: The number of bits, which is allocated according to a code block, is allocated in proportion to the number of code blocks and bits, which are allocated to code blocks of each code block size, are evenly allocated.

The embodiments described in the following show a case that code block segmentation is performed on a payload size equal to or greater than 1648 bits for an LDPC encoder. In this case, assume that a size of a CRC attached to a transport block and a code block corresponds to 24 bits.

Embodiment 1) Transport Block Size K=1920, r=¾

If a 24-bit CRC is attached, since transport block size K=1944>1648, code block segmentation is performed. When a code rate r corresponds to ¾, a supported code block size corresponds to 486, 972, and 1458 bits. Since an interaction formula 1992=2*(972+24) is satisfied, a code block is segmented into 2 code blocks each of which has a size of 972 bits.

Embodiment 2) Transport Block Size K=1668, r=½

If a 24-bit CRC is attached, since transport block size K=1692>1648, code block segmentation is performed. When a code rate r corresponds to ½, a supported code block size corresponds to 324, 648, and 972 bits. Since an interaction formula 1692=2*(822+24) is satisfied, a transport block can be segmented into 2 code blocks each of which has a size of 846 bits. However, since this size is not a supported code block size when the r corresponds to ½, segmentation is performed using a code block having a different size. Since an interaction formula 1692=2*648+324 is satisfied, a transport block is segmented into 2 code blocks each of which has a size of 648 bits and a code block of a size of 324 bits.

Embodiment 3) Transport Block Size K=1916, r=½

If a 24-bit CRC is attached, since transport block size K=1940>1648, code block segmentation is performed. When a code rate r corresponds to ½, a supported code block size corresponds to 324, 648, and 972 bits. Since an interaction formula 1940=2*970 is satisfied, a transport block can be segmented into 2 code blocks each of which has a size of 970 bits. However, this size is not a supported code block size when the r corresponds to ½. Since an interaction formula 1940=2*972−4 is satisfied, a transport block is segmented into 2 code blocks each of which has a size of 972 bits and then encoded bits can be generated by shortening a specific code block as much as 4 bits or shortening each of the code blocks as much as 2 bits.

The above-described embodiments may correspond to combinations of elements and features of the present invention in prescribed forms. And, it may be able to consider that the respective elements or features may be selective unless they are explicitly mentioned. Each of the elements or features may be implemented in a form failing to be combined with other elements or features. Moreover, it may be able to implement an embodiment of the present invention by combining elements and/or features together in part. A sequence of operations explained for each embodiment of the present invention may be modified. Some configurations or features of one embodiment may be included in another embodiment or can be substituted for corresponding configurations or features of another embodiment. And, it is apparently understandable that a new embodiment may be configured by combining claims failing to have relation of explicit citation in the appended claims together or may be included as new claims by amendment after filing an application.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for a communication device processing a data block based on a low-density parity-check (LDPC) encoder, the method comprising:
   receiving, from a base station (BS), information related to a code block segmentation for the data block;
   generating, by the LDPC encoder, code blocks based on the information related to the code block segmentation, wherein a size of a payload for the data block is equal to or greater than a threshold value;
   performing, by the LDPC encoder, error correction based on encoding for each of the code blocks; and
   transmitting, to the BS, the code blocks,
   wherein the code block segmentation is based on a payload size supported by a parity check matrix (H), and
   wherein the parity check matrix (H) is related to a coding rate of the LDPC encoder.

2. The method of claim 1, wherein the code block segmentation is performed to minimize a number of the code blocks.

3. The method of claim 1, wherein the code block segmentation is based on one of a plurality of payload sizes supported by the parity check matrix (H).

4. The method of claim 1, further comprising:
   performing rate matching or shortening, when a size of an encoded bit based on the encoding is not a size defined by the parity check matrix (H) related to the coding rate of the LDPC encoder.

5. The method of claim 4, wherein the rate matching comprises puncturing or repetition.

6. The method of claim 1, further comprising:
   attaching a cyclic redundancy check CRC to each of the code blocks after the code block segmentation.

7. The method of claim 1, wherein the payload is segmented into different payload sizes supported by the parity check matrix (H) related to the coding rate of the LDPC encoder.

8. A communication device for processing a data block, the communication device comprising:
   a radio frequency (RF) unit to transmit and receive information;
   a low-density parity-check (LDPC) encoder; and
   a processor connected to the RF unit and the LDPC encoder, and configured to:
   control the RF unit to receive, from a base station (BS), information related to a code block segmentation for the data block;
   control the LDPC encoder to generate code blocks based on the information related to the code block segmentation,
   wherein a size of a payload for the data block is equal to or greater than a threshold value;
   control the LDPC encoder to perform error correction based on encoding for each of the code blocks; and
   control the RF unit to transmit, to the BS, the code blocks,
   wherein the code block segmentation is based on a payload size supported by a parity check matrix (H), and
   wherein the parity check matrix (H) is related to a coding rate of the LDPC encoder.

9. The communication device of claim 8, wherein the code block segmentation is performed to minimize a number of the code blocks.

10. The communication device of claim 8, wherein the code block segmentation is based on one of a plurality of payload sizes supported by the parity check matrix (H).

11. The communication device of claim 8, wherein the processor is further configured to control the LDPC encoder to perform rate matching or shortening, when a size of an encoded bit based on the encoding is not a size defined by the parity check matrix (H) related to the coding rate of the LDPC encoder.

12. The communication device of claim 11, wherein the rate matching comprises puncturing or repetition.

13. The communication device of claim 8, wherein the processor is configured to attach a cyclic redundancy check CRC to each of the code blocks after the code block segmentation.

14. The communication device of claim 8, wherein the payload is segmented into different payload sizes supported by the parity check matrix (H) related to the coding rate of the LDPC encoder.

* * * * *